(12) United States Patent
Yoo et al.

(10) Patent No.: US 7,964,671 B2
(45) Date of Patent: Jun. 21, 2011

(54) THERMALLY CURABLE COMPOSITE RESIN COMPOSITION, PREPREG, COMPOSITE FILM AND LAMINATED MATERIAL FOR CIRCUIT HAVING THE SAME

(75) Inventors: Myong Jae Yoo, Seoul (KR); Woo Sung Lee, Seongnam-si (KR); Seong Dae Park, Seoul (KR); Se Hoon Park, Seongnam-si (KR)

(73) Assignee: Korea Electronics Technology Institute, Gyeonggi-do (KR)

( * ) Notice: Subject to any disclaimer, the term of this patent is extended or adjusted under 35 U.S.C. 154(b) by 773 days.

(21) Appl. No.: 11/857,034

(22) Filed: Sep. 18, 2007

(65) Prior Publication Data

US 2009/0011262 A1    Jan. 8, 2009

(30) Foreign Application Priority Data

Jul. 6, 2007    (KR) ........................ 10-2007-0068313

(51) Int. Cl.
*C08K 5/15*   (2006.01)
*C08F 36/00*  (2006.01)
*C08F 8/00*   (2006.01)

(52) U.S. Cl. ........ 525/191; 525/207; 525/217; 525/231; 525/242; 525/279; 525/282; 525/293

(58) Field of Classification Search .................. 525/191, 525/207, 217, 231, 242, 279, 282, 293
See application file for complete search history.

(56) References Cited

U.S. PATENT DOCUMENTS 6,100,334 A  *  8/2000  Abdou-Sabet ................ 525/191

* cited by examiner

*Primary Examiner* — Ana L Woodward
(74) *Attorney, Agent, or Firm* — Lee, Hong, Degerman, Kang & Waimey

(57) ABSTRACT

The present invention relates to a prepreg, a composite film, and a laminated material for circuit used for thermosetting composite resin compositions and printed circuit boards, and particularly to a thermosetting composite resin composition mixed with COP (Cyclo Olefin Polymer) and thermally cross-linkable resin, wherein the COP having excellent electrical characteristics at a high frequency and thermally cross-linkable resin are blended to allow having a less dielectric constant and a less dielectric loss than those of the conventional composite resin composition, and inorganic fillers such as ceramic material, metal material, carbon black are added to allow having dielectric characteristics covering from a low dielectric constant to a high dielectric constant.

4 Claims, 1 Drawing Sheet

THERMALLY CURABLE COMPOSITE RESIN COMPOSITION, PREPREG, COMPOSITE FILM AND LAMINATED MATERIAL FOR CIRCUIT HAVING THE SAME

CROSS-REFERENCE TO RELATED APPLICATION

The present application is based on, and claims priority from, Korean Application Number 10-2007-0068313, filed Jul. 6, 2007, the disclosure of which is incorporated by reference herein in its entirety.

TECHNICAL FIELD

Background Art

The following description relates generally to thermally curable (thermosetting or thermoplastic) composite resin composition, and particularly to thermally curable composite resin composition including COP (Cyclo Olefin Polymer) that is used for a printed wiring board, and more particularly to thermally curable composite resin composition including the COP and thermal cross-linked (thermally cross-linkable) resin, which are useable in printed wiring board, prepreg, sheet, film, tape, laminated plate or laminated material for circuit.

Concomitant with the need of processing a variety of information at a high speed in association with development of high information society, signal frequency bands used for communication and electronic devices have evolved to high frequency regions from MHz to GHz.

However, because electrical signals have a tendency of increasing the transmission loss as the frequency goes higher, there is a strong need of development for an electrically insulating material having an excellent high frequency transmission characteristic relative to high frequency bands and a substrate using the same. However, devices using high frequency signals suffer from a problem of signal delay on the printed wiring board, where the signal delay is proportionate to square root of permittivity of an insulating layer disposed around the wirings. Consequently, material having a low dielectric constant is needed for lessening the signal delay.

Polymer insulation material is commonly used as an electric insulating material to meet this characteristic. To be more specific, various resins usable as polymer insulation materials have been proposed that include, for example but not limited to, polyolefin resin, epoxy resin, fluorinated thermoplastic (thermosetting) resin, polyimide resin and bismaleid triazine resin. Furthermore, many efforts have been attempted to directly package passive components inside a substrate for manufacturing highly integrated substrates, and to this end, materials having various dielectric characteristics among the substrate characteristics are required. In order to comply with various dielectric characteristics, a method is known in the art for manufacturing a composite by mixing existing polymer materials with various fillers, where the composite must be manufactured with various thicknesses in the shape of a tape for high integration.

The conventional laminated plates (boards) for printed wiring boards are manufactured by mixing the polymer insulation materials alone or by mixing the polymer insulation materials with glass fibers, glass non-woven fabrics or inorganic fillers. There are largely two methods of manufacturing the laminated plate by mixing the above-mentioned components. The one is that prepreg obtained from polymer insulation materials which was melted in organic solvent, and immersed in glass fabric and dried, and metal foil are positioned, stacked, heated and pressurized by a hot press. The other one is that polymer insulation material that is not melted in organic solvent is melted by molten injection molding, processed to make a plate sheet, to which a metal foil is positioned, stacked, heated and pressurized. The metal foil largely used for the laminated plate includes a copper foil and an aluminum foil.

However, the epoxy resin commonly proposed as polymer insulation material suffers from a shortcoming that dielectric characteristics deteriorate particularly in a high frequency. Furthermore, the fluorinated thermoplastic resin represented by PTFE (polytetrafluoroethylene) also has a disadvantage in that, despite excellence in high frequency characteristics, expansion shrinkage is high due to its being the thermoplastic resin during forming process, which limits use for specific purpose.

The thermoplastic resin has another problem of deteriorated reverse heat resistance even if adhesion with a metal foil is obtained during a process into a laminated plate. The polyolefin resin suffers from a shortcoming of low heat resistance despite excellence in electric characteristics, particularly in dielectric characteristics due to its deficiency in polar group. The polyolefin resin suffers from another problem of low reliability in connection and through-hole plating when employed as a laminated plate for printed wiring board because of its high coefficient in linear expansion. The bismaleid triazine resin and polyimide resin have a very low activation as general purpose resin due to high prices.

As a result, need is required for composite resin composition having a low loss characteristic at a high frequency, and at the same time having a wider range of dielectric constants covering low and high dielectric constants, in manufacturing composite resin composition encompassing various ranges of dielectric constants.

SUMMARY

One object of the present invention is to provide a thermoplastic composite resin composition having a lower dielectric constant and a lower dielectric loss than those of the conventional composite resin composition by mixing COP (Cyclo Olefin Polymer) having excellent electrical characteristics and thermally cross-linking resin.

Another object is to manufacture a composite resin composition having a low loss characteristic in high frequency and wide ranges of dielectric constants ranging from low to high dielectric constants by further including ceramic materials, metal elements, carbon black and graphite in a thermoplastic composite resin composition mixed with the COP and thermal cross-linked (thermally cross-linkable or linking) resin.

Still another object is to provide a printed wiring board, a prepreg, a sheet, a film, a tape, a laminated plate or a laminated material for circuit adequate for high frequency, using composite resin composition comprised of COP having excellent electrical characteristics in high frequency and thermal cross-linked resin.

In one general aspect, a thermoplastic composite resin composition of low dielectric constant and low dielectric loss is manufactured by mixing COP (Cyclo Olefin Polymer) with thermal cross-linked resin.

In another general aspect, a thermoplastic composite resin composition having a wide range of dielectric constants covering from a low to a high dielectric constant is manufactured by mixing COP (Cyclo Olefin Polymer) with thermal cross-linked resin, and further includes inorganic filler selected from at least one or more from a group consisting of ceramic material, metal element, carbon black and graphite.

In another general aspect, a prepreg, wherein the thermoplastic composite resin composition is formed by being immersed in glass fiber, or a composite film, wherein the thermoplastic composite resin composition according to claim 1 or 6 is fabricated or processed in film, or a laminated material for circuit including a resin-based layer comprised of the thermoplastic composite resin composition, a releasable (peelable) film or a metal layer.

Other details of exemplary implementations are included in the detailed description and drawings, and now, the exemplary implementations will be described in detail with reference to the accompanying drawings.

DETAILED DESCRIPTION OF THE INVENTION

Figure 1:
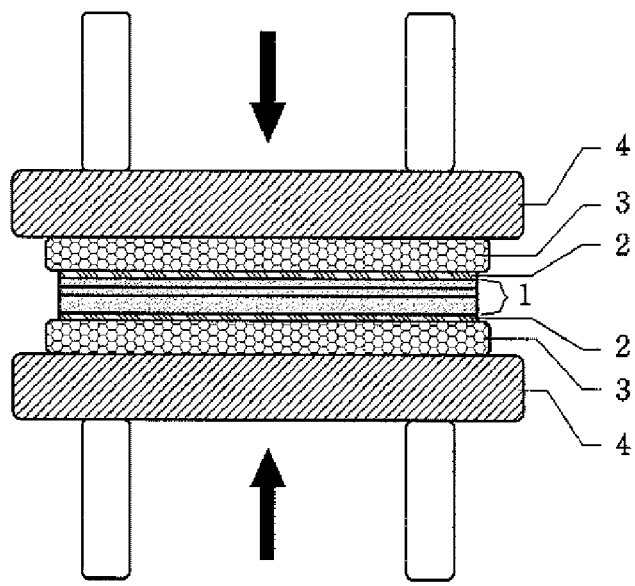
FIG. 1 is a mimetic rendition illustrating an exemplary implementation of a printed wiring board manufactured by using a sheet, a film or a prepreg composed of thermoplastic composite resin composition according to the present invention.

First, a first exemplary implementation of the present invention is a thermoplastic composite resin composition having a low dielectric constant and a low dielectric loss particularly at a high frequency, the composition made of COP (Cyclo Olefin Polymer) mixed with a thermally cross-linked resin.

The present inventive concept is to provide a thermoplastic composite resin composition of low dielectric constant and low dielectric loss, and to provide a printed wiring board manufactured using the composition. To this end, the COP resin having an excellent electrical characteristic at high frequency is employed here.

The printed wiring boards have been recently multi-layered and further densified. In the case of forming wiring layers in the printed wiring board using soldering, it is imperative that an electrical insulation material require heat resistance to the soldering, and the soldering for forming the wiring layer require materials free from lead for the environmental safety. However, in soldering that is not used with lead, a metal having a higher melting point than that of the lead is used so that heat resistance is further required for an electrical insulation layer. Practical use of the COP resin having excellent electrical, mechanical, shock-resistant and weather-resistant characteristics is under way for a wide range of compacts. As a result, the COP resin was chosen as resin for the base layer (resin base layer) of the thermoplastic composite resin composition.

A predetermined shape of tape film may be manufactured from the COP resin composition alone, but the COP resin has a difficulty in use as a printed wiring board because an intrinsic glass transition temperature (tg) of the COP is less than 170 degrees Celsius (hereinafter Celsius is omitted). Particularly, the COP must stand a 280 degree-heat for 10 seconds in a heat resistance experiment for soldering process, and in order to come up with the heat resistance, the COP is blended with a predetermined amount of thermally cross-linked resin to manufacture the composite resin composition.

Preferably, the COP and the thermally cross-linked resin are mixed in weight ratio of 95:5 to 80:20. For example, in case of containing 95-80 parts by weight of the COP, 5 to 20 parts by weight of the thermally cross-linked resin may be contained. If deviated from the above scope, effects of electrical characteristics by the COP may be deteriorated, the heat resistance may be lacking, or it is difficult to manufacture in tape type film.

Therefore, it is preferable that a base resin fabricated by mixing the COP and the thermally cross-linked resin be manufactured by being melted in a predetermined amount of organic solvent.

To be more specific, the COP used in the instant application may be obtained by Cyclo Olefin monomer. Particularly, the Cyclo Olefin monomer obtained by ring-opening polymerization along with double decomposition polymerization catalyst preferably helps to simultaneously secure the COP in the manufacturing process of the thermoplastic composite resin composition of the present invention, thereby facilitating the productivity and exhibiting excellent properties.

The Cyclo Olefin monomer used for manufacturing of the COP is an Olefin having an alicyclic structure within a molecule. The alicyclic structure includes, for example but not limited to, mono-cyclic structure, poly-cyclic structure, condensation poly-cyclic structure, bridged ring structure and compounding poly-cyclic structure. The carbon number comprising the alicyclic structure is not particularly limited, but usually the number is 4 to 30, preferably 5 to 20 and more preferably 5 to 15. The cyclo olefin monomer may include mono cyclo Olefin monomer and Norbornene-based monomer, dicyclopentadiene, tetracyclododecene, and norbornene, which may be substituted by hydrocarbon group including alkyl group, alkenyl group, alkylidene group and aryl group or polar group. Furthermore, the Cyclo Olefin may include other double bonds besides the double bond of norbornene-ring. The mono cyclo Olefin monomer may include cyclobutene, cyclopetene, cyclo octene, cyclododecene and 1,5-cyclooctadiene.

The detailed example of the Norbornene-based monomer may include dicyclopentadiene including dicyclopentadiene and methyldicyclopentadiene; tetracyclododecene including tetracyclo[6.2.1.13,6.02,7]dodeca-4-en),9-ethylidenetetracyclo[6.2.1.13,6.02,7]dodeca-4-en), 9-phenyltetracyclo[6.2.1.13,6.02,7]dodeca-4-en), tetracyclo[6.2.1.13,6.02,7]dodeca-4-en-carboxylic acid), and tetracyclo[6.2.1.13,6.02,7]dodeca-4-en-dicarboxylic acid anhydride; norbornene including 2-norbornene, 5-ethylidene-2-norbornene, 5-vinyl-2-norbornene, 5-phenyl-2-norbornene, acrylic acid 5-norbornene-2-il, methacrylic acid 5-norbornene-2-il, 5-norbornene-2-carboxylic acid, 5-norbornene-2,3-dicarboxylic acid, and 5-norbornene-2,3-dicarboxylic acid anhydride; oxanorbornene including 7-oxa-2-norbornene and 5-ethylidene-7-oxa-2-norbornene; and cyclic olefin of more than 4-cyclic including tetracyclo[9.2.1.02,10.03,8]tetradeca-3,5,7,12-tetraen, or 1,4-metano-1,4,4a,9a-tetrahydro-9H-fluorene, pentacyclo[6.5.1.13,6.02,7.09,3]pentadeca-4,10-dien), and pentacyclo[9.2.1.14,7.02,10.03,8]pentadeca-5,12-dien. Use of cyclo olefin monomer of hydrocarbon having no polar group may obtain low dielectric loss tangent. More than 0.1 weight % of vinyl group including 9-vinyltetracyclo[6.2.1.13,6.02,7]dodeca-4-en, 5-vinyl-2-norbornene, acrylic acid 5-norbornene-2-il, and methacrylic acid 5-norbornene-2-il, methacryloyl group or norbornene monomer having acryloyl group, out of the cyclo olefin monomers relative to the entire cyclo olefin monomers may enhance the radical cross-linking reaction, which in turn enhance the thermal resistance of the COP and the thermosetting composite resin composition of the present invention.

Particularly, if the thermosetting composite resin composition is employed for electrical insulation material useable for high frequency, and if norbornene monomer having the vinyl group including 9-vinyltetracyclo[6.2.1,13,6.02,7] dodeca-4-en), and 5-vinyl-2-norbornene is blended thereto, the low dissipation factor is preferably obtained. One kind of the above-mentioned Cyclo Olefin monomer may be used alone, or two or more kinds may be mixed and used.

Furthermore, various kinds of thermally cross-linkable resin may be used including, for example but not limited to, acrylate compound of more than bifunctional group including Trimethylolpropane triacrylate, Trimethylolpropane trimethacrylate, Tricyclodecanedimethanol diacrylate, and Tris (2-hydroxyethyl)isocyanurate triacrylate, triallyl cyanurate and triallyl isocyanurate, phenylenemaleimide, phenylenedimaleimide, N,N'-m-phenylenedimaleimide. Among these, phenylenedimaleimide may be preferably used, cross-linking agent of N,N~-M-Phenylenedimaleimide may be more preferably used, and as illustrated in the following Formula 1, it is most preferable that the cross-linking agent be used as thermally cross-linkable agent.

[Formula 1]

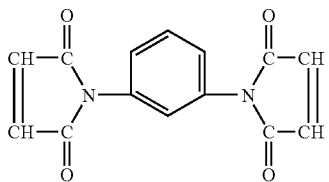

Meanwhile, with a view to improving the properties within the scope of not obstructing the objects of the present invention, the thermosetting composite resin composition may be added, if necessary, by additive agents including thermoplastic elastomers, vulcanised rubbers, oligomers, nucleating agents, antioxidants, heat stabilizers, light stabilizers, ultraviolet absorbers, lubricants, fire retardant adjuvants, antielectrostatic agents, anti-foggants, fillers, softening agents, plasticizers, and stains. These agents may be used alone or in a combination of two or more thereof.

Among the foregoing agents, the thermosetting composite resin composition may further include an initiator, which is to add a predetermined amount of peroxide accelerator as a catalyst for promoting the thermosetting. The peroxide accelerator may usefully include peroxy ester and dialkyl, and may particularly prefer Perbutyl P, where the peroxide accelerator may be more preferably included in weight ratio ranging from 1:15 to 1:25 with the thermally cross-linkable resin.

The content of the initiator is most adequate to promote the thermosetting of the thermosetting composite resin composition within the above-stated scope. Furthermore, poly (styrene-butadiene-styrene) copolymer), polybutadiene and poly μ(styrene-butadiene) copolymer may be used as auxiliary additives for promoting flexibility and processability of the polymer film. The auxiliary additive is preferably added in the weight ratio of 1:10 to 1:5 relative to COP base resin. Besides, oxidation stabilizer, fire retardant adjuvant, plasticizer and stain may be added, if necessary.

Various methods can be utilized to manufacture the resin composition of this invention. Examples of useful methods include a direct kneading method wherein a formulation of the resin, inorganic compound and one or more optional additives is directly blended and kneaded under normal temperature or under heat conditions, and a method which involves mixing those ingredients in a solvent and subsequently removing the solvent; a masterbatch method wherein a masterbatch is first prepared by incorporating a prescribed or greater amount of the inorganic compound in the resin or other resin and kneading them, and this masterbatch in a prescribed amount, the resin in the amount that makes up the deficiency and one or more optional additives in their prescribed amounts are kneaded or mixed in a solvent under normal temperature or under heat conditions.

The thermosetting composite resin composition according to the present invention thus described includes a composite composition blended with the thermally cross-linkable resin along with the COP having an excellent electrical characteristic at a high frequency, and particularly defines the thermosetting composite resin composition having a low permittivity and low loss at the high frequency.

In comparison, another implementation mode of the thermosetting composite resin composition according to the present invention may further include inorganic fillers such as ceramic material, metal material, carbon black and graphite in addition to the COP and the thermosetting composite resin composition blended with the thermally cross-linkable resin, to thereby obtain a low loss characteristic at a high frequency, and a wide scope of permittivity ranging from low to high dielectric constants as well.

As noted above, the present inventors came to know that the above-fabricated composite resin composition applied by various fillers could possess a dielectric constant characteristic ranging from low to high dielectric constants in the course of manufacturing composite composition having an excellent dielectric constant characteristic ranging from low to high dielectric constants, and also came to ascertain that increase in the dielectric constant characteristic could increase the content of applied fillers.

The fillers usable in the present invention variably include metal materials, ceramic materials, carbon fillers and graphite. The metal materials may include all the metals and their alloys in Groups I to IIV of the Periodic Table, for instance, Al, Cu, Ni, Fe, Ag, Ti, Cr, Si, Mg, Zn, Sn, Pb, Ti, Zr, Ta, Pt, and their alloys. The ceramic materials may include well-known ferroelectrics such as $BaTiO_3$, $SrTiO_3$, $TiO_2$ and PZT, and paraelectrics having a dielectric constant of 100 or more. The carbon fillers may include graphite and carbon black. The average particle size of the filler in the range of 0.1 μm~10 μm suffices to satisfy the fabrication of the composite composition, and more preferably in the range of 0.5 μm~5 μm. The average particle size exceeding 10 μm would make it difficult to fabricate a tape of a uniform thickness using the composite composition. The content of the inorganic filler is preferably 10~80% in volume fraction when an aggregate volume of the polymer composition blended by the COP and the thermally cross-linkable resin and the inorganic filler is given as 100, and more preferably, 30~70%.

If a filler (an inorganic filler) material is less than 10 Vol. %, the enhancement effect of the dielectric constant was found to be almost nil, and if it is more than 80 Vol. %, it was found to be difficult to fabricate a film due to excessive filler content, and the fabricated film has lost its flexibility and has had difficulty in handling because it was brittle or crack-prone.

Furthermore, the thermosetting composite resin composition blended by the COP and the thermally cross-linkable resin that further includes inorganic fillers and that has an excellent dielectric constant characteristic ranging from low to high dielectric constants may further includes a predetermined amount of peroxide accelerator as an initiator, the details of which have been already explained in the foregoing.

Meanwhile, use of the thermosetting composite resin composition is not particularly limited, and may be adequately used, for example but not limited to, for substrate materials for forming a core layer or built-up layer of a multilayer substrate, sheets, laminated plates (boards), copper foils attached with resin, copper clad laminated boards, TAB (Tape Automated Bonding) tapes, printed wiring boards, prepreg and varnish by forming or processing in films.

The substrate materials, sheets, laminated plates, copper foils attached with resin, copper clad laminated boards, TAB tapes, printed wiring boards, prepreg and adhesive sheets fabricated by using the resin composition according to the present invention may also belong to the present invention.

The prepreg according to the present invention includes the afore-mentioned resin composition and fabric material. The thermosetting composite resin composition according to the present invention is solved in organic solution to prepare varnish, where prepreg is produced by coating, immersing and drying the fabric material with a resin composition. Preferably, the amount of resin composition following the drying is the amount which is sufficient enough to fill voids of the fabric materials. Alternatively, the prepreg may be obtained by semi-curing the resin composition in film shape, which is pressed by a heat press with the fabric material. The material for the fabric material is preferably a heat resistant fabric, and more specifically, may include carbon fiber, glass fiber, aramid fiber, aromatic polyester fiber, boric fiber, silica fiber or tetrafluoro carbon fiber.

The fibers are not limited to these examples. One kind of these fibers may be used alone, or two or more kinds may be mixed and used. Aramid fiber, aromatic polyester fiber and tetrafluoro carbon fiber are preferred. These fibers may be either short fiber or long fiber, and may be used as woven fabric or non-woven fabric.

Furthermore, two or more prepreg sheets may be stacked to obtain the laminated plates. The surface of the prepreg sheets or laminated plates may be smoothened using thermal laminators and calendars. A metal laminated plate is manufactured by forming a metal layer which is made of a laminated plate, one surface or both surfaces thereof being laminated by metal foils. The metal layer is preferably a metal foil consisting of copper, nickel silver, silver, iron 42 alloy and stainless, having thickness in the range of 5 µm~200 µm.

One surface or both surfaces of a laminated plate filled with semi-cured resin composition is integrally laminated with a metal foil by a press, a vacuum press or a thermal laminator, or one surface or both surfaces of the laminated plate filled with cured resin composition is thermally pressed with a metal foil to thereby manufacture a metal foil laminated plate. Furthermore, the laminated plate may be formed at a surface thereof with a protective releasing film. The protective film may include polypropylene film, fluorine resin film, polyethylene film polyethyleneterephthalate film and paper, and in some cases, these films may be provided with silicon resin for releasablity. The foregoing metal foil laminated plate may be used for various kinds of predetermined printed wiring boards by well-known conventional processes to the metal layer including etching process.

Furthermore, the laminated material for circuit (resin film, metal foil adhered by resin base) essentially includes a resin base layer consisting of the above-mentioned thermosetting composite resin composition. The metal foil adhered by resin film or resin base which is one aspect of the laminated plate for circuit according to the present invention includes the resin base layer and a releasing (peelable) film or a metal layer. In the resin film consisting of the resin base layer and the releasing film, the releasing film functions as an imaginary support to protect the resin base layer when in circulation but is released when in use. The releasing film may include polypropylene film, fluorine resin film, polyethylene film, polyethylene terephthalate film and paper, and in some cases, these films may be provided with silicon resin for releaseablity. The resin film may include other layers than the resin base layer and the releasing film, and other layers may be interposed between the resin base layer and the releasing film. The other layers may include, for instance, layers consisting of adhesives of other components.

Preferably, the releasing film is directly formed on the resin base layer, or the resin base layer and the releasing film are abutted thereagainst to manufacture a laminated material for circuit having a low dielectric constant. Furthermore, the metal foil adhered by resin base formed with the resin base layer by coating one surface or both surfaces of the metal layer with the thermosetting low dielectric resin composition may be further laminated with a protective releasing film on the resin base layer. The same thing as the releasing film may be used for the protective film. The metal foil adhered by the resin film and the resin base may be obtained by the thermosetting low dielectric resin composition being coated on one surface of the releasing film or one surface or both surfaces of the metal layer, and dried.

The resin film is interposed between an inner layer wiring board initially-prepared with a circuit by peeling off the releasing film and an outer layer wiring board, to which pressure and heat are applied to form a multilayer metal stacked board. An outer layer of the multilayer metal stacked board is formed by etching, which is a well-known process for forming a conventional predetermined circuit, to thereby form a multilayer printed wiring board. In case of using a metal foil adhered by a resin base, the metal foil is adhered by an inner layer wiring board formed with a circuit, to which the well-known process for forming a conventional predetermined circuit is applied, to thereby obtain a multilayer printed wiring board. The multilayer printed wiring boards are not prominent in cross eyes, and can absorb the roughness of the inner layer wiring board to prevent the roughness from being exposed outside of the surface of the outer layer. This helps create a smoothened surface and is adequate to a minute wiring formation. Furthermore, the resin base layer, due to its good film formation property, can prevent problems such as breakage, fracture and omission of resin that may occur in the cutting, layering processes and the like. The resin base layer also limits the thinning of interlayer insulation layer where the inner circuit exists during the heat/pressure application used as insulation material for interlayer connection of the multiplayer boards. The resin base layer further helps avoid the occurrence of degradation and short circuit of the interlayer insulation resistance. Furthermore, the resin base layer exhibits a high heat resistance, a low dielectric dissipation factor, a low dielectric loss tangent, and an excellent adhesiveness, such that dissipation of resin is very limited to further increase propagation speed of electrical signals to thin circuit boards, enabling to process the signals at a high speed.

FIG. 1 is a mimetic rendition illustrating an exemplary implementation of a printed wiring board manufactured by using a sheet, a film or prepreg composed of thermoplastic composite resin composition according to the present invention.

Referring to FIG. 1, a printed wiring substrate using the composite resin composition thus fabricated may be obtained in such a manner that metal foils (2) are formed on lower and upper surfaces of a sheet, a film or a prepreg (1) formed by using the composite resin composition, metal plates (3) and melting pads are arranged on both sides thereof, which is then inserted into a press (4) for heat and pressure.

The processing method of the printed wiring substrate is not particularly specified. Examples of processing methods include an extrusion method wherein the resin composition is melt kneaded by an extruder and then formed into a film as by a T-die or a circular die; a casting method wherein the resin composition is dissolved or dispersed in an organic or other solvent and then cast into a film; a dipping method wherein the resin composition is dissolved or dispersed in an organic or other solvent to provide a varnish into which a cloth-like or nonwoven-like base of an inorganic material, such as glass, or an organic polymer is subsequently dipped to form a film; and the like. Among them, the extrusion method is more suitable for provision of a thin multilayer board. The base used in the dipping method is not particularly specified and may comprise a glass cloth, aramid fibers, polyparaphenylene benzoxazole fibers or the like, for example.

Since the substrate material, sheet, laminate board, resin-bearing copper foil, copper-clad laminate, TAB tape, printed wiring board, prepreg, adhesive tape and optical circuit forming material of this invention comprise the resin composition of this invention, they all exhibit improved high-temperature properties, dimensional stability, solvent resistance, moisture resistance and barrier properties, and can be obtained at high yields even if they are manufactured via multiple processes. In this specification, the sheet is referred to as encompassing non-self supporting films. The sheet may be embossed at its surface to better its slip characteristics.

Preferred embodiments of the present invention will now be described in detail with reference to the annexed drawings by way of non-limiting embodiments. The innovative concepts described in the present application can be better understood by these exemplary embodiments, and it should be apparent that the embodiments are not limited by any of the details of the foregoing description and the scope of the following claims.

FIRST EMBODIMENT

Manufacturing of Thermosetting Composite Resin Composition Having a Low Dielectric Constant and a Low Dielectric Loss First, the COP resin was blended and melted in organic solvent. The organic solvent of less volatility used for the melting had a boiling point of less than 150 degrees, the physical properties of which are advantageous to fabrication of tapes and films according to the instant invention. The composition thus melted was mixed with the thermally cross-linked resin and initiator to thereby manufacture the thermosetting composite resin composition of low dielectric constant and low dielectric loss.

Zeonex480r (commercial product of Zeon Corporation) was used as a resin base layer for the COP, and one of the phenylenedimaleimide, which is N,N'-m-phenylenedimaleimide (commercial product of Sartomer Company) was used as the thermally cross-linked resin, and Perbutyl P was employed as the initiator. The dielectric constant and dielectric loss characteristics in association with the detailed constituents of these resins are given in Table 1, and the constituents are shown by weight ratio.

TABLE 1

[Composition and dielectric characteristics of thermosetting composite resin composition of low dielectric constant and low dielectric loss]

| Base layer | Thermally cross-linked resin | Initiator | Thermally cross-linked resin/Initiator | Dielectric factor | | Dielectric loss | |
|---|---|---|---|---|---|---|---|
| | | | | 1 GHz | 9.4 GHz | 1 GHz | 9.4 GHz |
| 95 | 5 | Perbutyl P | 20 | 2.46 | 2.43 | 0.0012 | 0.0019 |
| 90 | 10 | Perbutyl P | 20 | 2.48 | 2.46 | 0.0017 | 0.002 |
| 85 | 15 | Perbutyl P | 20 | 2.49 | 2.47 | 0.0021 | 0.004 |
| 80 | 20 | Perbutyl P | 20 | 2.55 | 2.52 | 0.0023 | 0.0042 |

It could be noted from the Table 1 that the thermosetting composite resin composition according to the instant invention had a dielectric constant of less than 2.6 at 9.4 GHz, and a dielectric loss of less than 0.005.

In contrast thereto, in case of other compositions provided for printed wiring boards, LX67F substrate provided by Hitachi of Japan characteristically had a dielectric constant of more than 3.4 with a dielectric loss of 0.0028, while PCL-LD621 supplied by Cookson of USA had a dielectric constant of 3.4 with a dielectric loss of 0.007. In comparison with the conventional products, it could be confirmed from the implementations of the present invention that an excellent electrical characteristics at a high frequency band could be obtained in which both the dielectric constant and the dielectric loss were low.

The following Table 2 shows that the COP itself lacks in a heat-resistant property but has improved by being blended with the thermally cross-linked resin and the initiator.

TABLE 2

[Heat-resistance experimental result of thermosetting composite resin composition of low dielectric constant and low dielectric loss]

| Base layer | Thermal cross-linked resin | Initiator | Thermally cross-linked resin/Initiator | 260□, 10 seconds |
|---|---|---|---|---|
| 100 | | Perbutyl P | | x |
| 90 | 10 | Perbutyl P | 20 | ○ |
| 80 | 20 | Perbutyl P | 20 | ○ |

SECOND EMBODIMENT

Manufacturing of Thermosetting Composite Resin Composition Having a Property in the Range of Low to High Dielectric Constant The thermosetting composite resin composition having a physical property of low to high dielectric constant that was obtained by mixing the COP with the thermally cross-linked resin and inorganic filler was manufactured by mixing the composite resin composition of the First Embodiment with weight-estimated Al filler using a conventional ball-milling process. If a tape is manufactured using the composite composition thus fabricated through a conventional tape casting process, the tape can have a thickness in the range of 30 µm to 200 µm.

Figure 2:
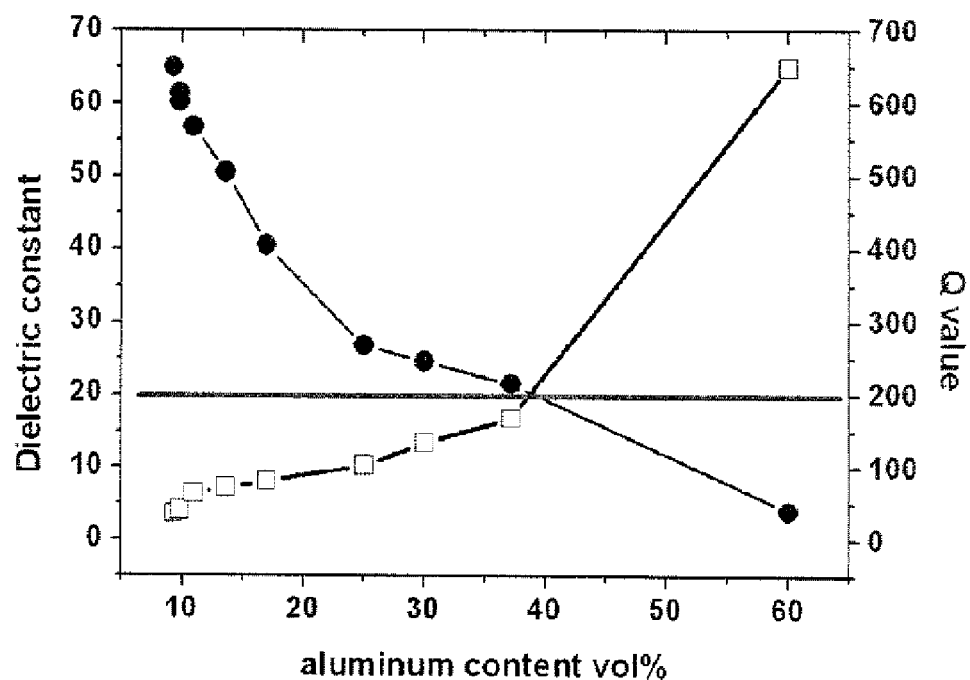
FIG. 2 is a graph explaining a result showing in wide ranges a dielectric characteristic at high frequency relative to quantity of inorganic filler included in the thermoplastic composite resin composition.

FIG. 2 shows a dielectric characteristic at a high frequency of the thermosetting composite resin composition having a physical property of low to high dielectric constants manufactured by using A1 as filler. As illustrated, it could be confirmed that the dielectric constant ranged from 4 to 65, and Q value (an inverse value of the dielectric loss) ranged from 50 to 650 in response to filler contents. Measurement of the dielectric characteristics was conducted at 1 to 10 GHz.

The dielectric characteristics of the thermosetting composite resin composition having low to high dielectric constants showed the same trends even if other types of fillers were used. In other words, the dielectric constant increased while the Q value decreased in response to increased filler contents. However, the dielectric constant and Q value obtained by mixing the composite resin composition with the same contents according to kinds of used fillers may somewhat differ, an example of which is given by the following Table 3. The Table 3 shows dielectric characteristics of a multilayer substrate manufactured by the composite composition fabricated in the above-described method. Measurement of the dielectric characteristics was conducted at 1 to 10 GHz.

TABLE 3

[Dielectric characteristics of multilayer substrate manufactured utilizing composite composition]

| volume % | TiO2 | Zinc | Aluminum |
|---|---|---|---|
| | dielectric constant at 2 GHz | | |
| 30 | 7 | 9.2 | 11 |
| 50 | 13 | 42 | 25 |
| 70 | 22 | 216 | 115 |

Furthermore, the following Table 4 shows dielectric characteristics of a multilayer substrate manufactured utilizing a composite composition fabricated by using carbon black filler among carbon fillers. It should be apparent from Table 4 that the carbon black filler had a particular advantage over other fillers in manufacturing substrates of high dielectric constant.

TABLE 4

[Dielectric characteristics of multilayer substrate manufactured using composite composition applied with carbon filler]

| wt % | XC72R dielectric constant at 0.1 GHz |
|---|---|
| 1.5 | 9 |
| 2 | 22 |
| 4 | 1750 |

THIRD EMBODIMENT

Manufacturing of Multilayer Substrate

Referring to FIG. 1, metal foils were arranged on and under tapes, films or prepregs formed by using composite composition manufactured according to the first and second embodiments, and metal plates and melting pads were arranged on both sides thereof, which was pressed with heat to thereby obtain the multilayer substrate according to the present invention. The temperature was conventionally given in the range of 100 to 300 degrees in consideration of softening point of base layer and response temperature of cross-linking agent and peroxide. Preferably, the surface pressure applied to a press is 1 to 20 MPa.

Meanwhile, although the foregoing description contains many specifics, these are not to be construed as limiting the scope of the present invention, but merely providing certain exemplary embodiments. It should be apparent to the skilled in the art that the scope of the invention is, therefore, indicated and limited only by the appended claims and their legal equivalents, rather than by the foregoing description. All additions, deletions, and modifications to the invention, as disclosed herein, which fall within the meaning and scope of claims are encompassed by the present invention.

As apparent from the foregoing, a thermosetting composite resin composition having a lower dielectric constant and a lower dielectric loss than those of the conventional composite resin composition can be provided by mixing COP (Cyclo Olefin Polymer) having excellent electrical characteristics and thermally cross-linking resin.

Furthermore, a composite resin composition having a low loss characteristic at a high frequency and wide ranges of properties covering from low to high dielectric constants can be provided by further including ceramic materials, metal elements, carbon black and graphite in a thermosetting composite resin composition mixed with the COP and thermally cross-linkable resin.

Still furthermore, a printed wiring board, a prepreg, a sheet, a film, a tape, a laminated plate or a laminated material for circuit adequate for high frequency can be provided by using composite resin composition comprised of COP having excellent electrical characteristics in high frequency and thermally cross-linked resin.

What is claimed is:

1. A thermosetting composite resin composition manufactured by mixing COP (Cyclo Olefin Polymer) with Phenylenedimaleimide resin, the composition further comprising a peroxide accelerator as a catalyst,
    wherein the COP and the Phenylenedimaleimide resin are mixed in a weight ratio of 95:5 to 80:20, and
    wherein the peroxide accelerator and the Phenylenedimaleimide resin are mixed in a weight ratio of 1:15 to 1:25.

2. The composition as claimed in claim 1, wherein the Phenylenedimaleimide resin is N,N'-m-Phenylenedimaleimide.

3. The composition as claimed in claim 1, wherein the Phenylenedimaleimide resin is a cross-linkable agent represented by the following Formula 1,

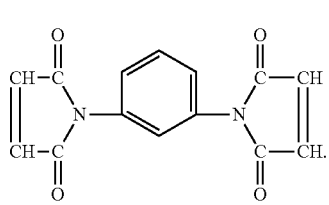

[Formula 1]

4. A composite film formed by fabricating or processing the composition according to claim 1 in film.

* * * * *